United States Patent
Shim et al.

(10) Patent No.: US 9,475,092 B2
(45) Date of Patent: Oct. 25, 2016

(54) ELECTRO-ACOUSTIC TRANSDUCER AND METHOD OF MANUFACTURING THE SAME

(71) Applicant: SAMSUNG ELECTRONICS CO., LTD., Suwon-si (KR)

(72) Inventors: Dong-sik Shim, Hwaseong-si (KR); Seog-woo Hong, Yongin-si (KR); Seok-whan Chung, Hwaseong-si (KR); Chang-jung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/287,556

(22) Filed: May 27, 2014

(65) Prior Publication Data

US 2015/0163599 A1    Jun. 11, 2015

(30) Foreign Application Priority Data

Dec. 5, 2013    (KR) .................. 10-2013-0150840

(51) Int. Cl.
- *H04R 25/00* (2006.01)
- *B06B 1/02* (2006.01)
- *B81C 1/00* (2006.01)

(52) U.S. Cl.
CPC ......... *B06B 1/0292* (2013.01); *B81C 1/00182* (2013.01); *Y10T 29/49005* (2015.01)

(58) Field of Classification Search
CPC .............................. H04R 15/00; H04R 17/005
USPC ................ 381/150–155; 257/416; 438/3
See application file for complete search history.

(56) References Cited

U.S. PATENT DOCUMENTS

| | | | |
|---|---|---|---|
| 8,324,006 B1 | 12/2012 | Adler et al. | |
| 2005/0101047 A1* | 5/2005 | Freeman | B81C 1/00666 438/48 |
| 2006/0093171 A1* | 5/2006 | Zhe | H04R 31/003 381/191 |
| 2009/0140609 A1 | 6/2009 | Huang | |
| 2010/0268089 A1* | 10/2010 | Degertekin | G01N 29/2406 600/467 |
| 2011/0241563 A1* | 10/2011 | Kim | G09G 3/3225 315/291 |
| 2012/0321108 A1* | 12/2012 | Lin | H04R 1/06 381/150 |

FOREIGN PATENT DOCUMENTS

| | | |
|---|---|---|
| KR | 10-2013-0021657 A | 3/2013 |
| KR | 10-2013-0070197 A | 6/2013 |
| WO | 2012/075106 A9 | 6/2012 |

* cited by examiner

*Primary Examiner* — Curtis Kuntz
*Assistant Examiner* — Julie X Dang
(74) *Attorney, Agent, or Firm* — Sughrue Mion, PLLC

(57) ABSTRACT

An electro-acoustic transducer includes: a conductive substrate in which a first trench is formed, and which includes an electrode connection unit surrounded by the first trench; a membrane provided on the conductive substrate; an upper electrode provided on the membrane to contact an upper surface of the electrode connection unit; a first electrode provided on a lower surface of the conductive substrate to contact a lower surface of the electrode connection unit; and a second electrode spaced apart from the first electrode and provided to contact the lower surface of the conductive substrate.

7 Claims, 14 Drawing Sheets

_US 9,475,092 B2_

ELECTRO-ACOUSTIC TRANSDUCER AND METHOD OF MANUFACTURING THE SAME

CROSS-REFERENCE TO RELATED APPLICATION

This application claims priority from Korean Patent Application No. 10-2013-0150840, filed on Dec. 5, 2013, in the Korean Intellectual Property Office, the disclosure of which is incorporated herein in its entirety by reference.

BACKGROUND

1. Field

The present disclosure relates to an electro-acoustic transducer, and more particularly, to a capacitive micro-machined electro-acoustic transducer and a method of manufacturing the same.

2. Description of the Related Art

An electro-acoustic transducer is a device that converts electric energy into acoustic energy or vice versa, and may include an ultrasonic transducer, a microphone, and the like. A micro-machined electro-acoustic transducer includes a micro-electro-mechanical system (MEMS), and a typical example thereof is a micro-machined ultrasonic transducer (MUT). The MUT is a device that converts electric signals into ultrasonic signals or vice versa, and may be classified into a piezoelectric MUT (pMUT), a capacitive MUT (cMUT), a magnetic MUT (mMUT), and the like, according to a converting method of the MUT. Generally, the pMUT has been mainly used, but recently, as the cMUT has been developed, cMUT applications have increased. The cMUT is advantageous in terms of the transmission and reception of broadband signals, integrated manufacturing by using semiconductor processing, and integration with electric circuits. The cMUT is preferred to manufacture medical diagnostic imaging devices and sensors.

SUMMARY

One or more exemplary embodiments provide a capacitive micro-machined electro-acoustic transducer and a method of manufacturing the same.

Additional aspects will be set forth in part in the description which follows and, in part, will be apparent from the description, or may be learned by practice of the presented exemplary embodiments.

According to an aspect of an exemplary embodiment, an electro-acoustic transducer including: a conductive substrate in which a first trench is formed, and including an electrode connection unit surrounded by the first trench; a membrane provided on the conductive substrate; an upper electrode provided on the membrane to contact an upper surface of the electrode connection unit; a first electrode provided on a lower surface of the conductive substrate to contact a lower surface of the electrode connection unit; and a second electrode spaced apart from the first electrode and provided to contact the lower surface of the conductive substrate.

A cavity may be formed in an upper surface of the conductive substrate to have a predetermined depth, and the membrane may be provided on the upper surface of the conductive substrate to cover the cavity. The electro-acoustic transducer may further include: a first insulating layer provided on the lower surface of the conductive substrate; and a second insulating layer provided in inner wall surfaces of the first trench and the cavity.

A support in which a cavity is formed may be provided on the conductive substrate, and a membrane may be provided on an upper surface of the support to cover the cavity. The electro-acoustic transducer may further include: a first insulating layer provided on the lower surface of the conductive substrate; and a second insulating layer provided on a bottom surface of the cavity.

The electro-acoustic transducer may further include: a pad substrate coupled to the conductive substrate and including a plurality of pads bonded to the first electrode and the second electrode. A second trench for separating elements may be formed in the conductive substrate.

According to another aspect of an exemplary embodiment, a method of manufacturing an electro-acoustic transducer, the method including: preparing a first wafer including a first substrate, a first insulating layer, and a second substrate; forming a first trench surrounding an electrode connection unit in the first substrate and then forming a cavity having a predetermined depth in an upper surface of the first substrate; forming a second insulating layer on a surface of the first substrate; preparing a second wafer including a third substrate, a third insulating layer, and a fourth substrate and then bonding the fourth substrate onto the first substrate; removing the second substrate, and then forming first and second electrodes on the first insulating layer to contact a lower surface of the electrode connection unit and a lower surface of the first substrate; removing the third substrate and the third insulating layer; and forming an upper electrode on the fourth substrate to contact an upper surface of the electrode connection unit.

The forming of the first trench and the forming of the cavity may include: forming a passivation layer on the first substrate; patterning the passivation layer to expose a cavity forming region of the first substrate; oxidizing the cavity forming region to form an oxide layer; forming the first trench in the first substrate; and removing the oxide layer to form the cavity in an upper surface of the first substrate.

The first and second electrodes and the plurality of pads may be bonded by eutectic bonding.

According to another aspect of an exemplary embodiment, a method of manufacturing an electro-acoustic transducer, the method including: preparing a first wafer including a first substrate, a first insulating layer, and a second substrate; forming a first trench surrounding an electrode connection unit in the first substrate; forming a support including a cavity on the first substrate and then forming a second insulating layer on a bottom surface of the cavity; preparing a second wafer including a third substrate, a third insulating layer, and a fourth substrate and then bonding the fourth substrate onto the first substrate; removing the second substrate, and then forming first and second electrodes on the first insulating layer to contact a lower surface of the electrode connection unit and a lower surface of the first substrate; removing the third substrate and the third insulating layer; and forming an upper electrode on the fourth substrate to contact an upper surface of the electrode connection unit.

The first substrate may include a conductive material.

The forming of the first trench may include: forming a passivation layer on the first substrate and then, patterning the passivation layer to expose an upper surface of the first substrate; and forming the first trench in the first substrate. The forming of the support may include: oxidizing an exposed surface of the first substrate to form the support; and removing the passivation layer to form the cavity.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
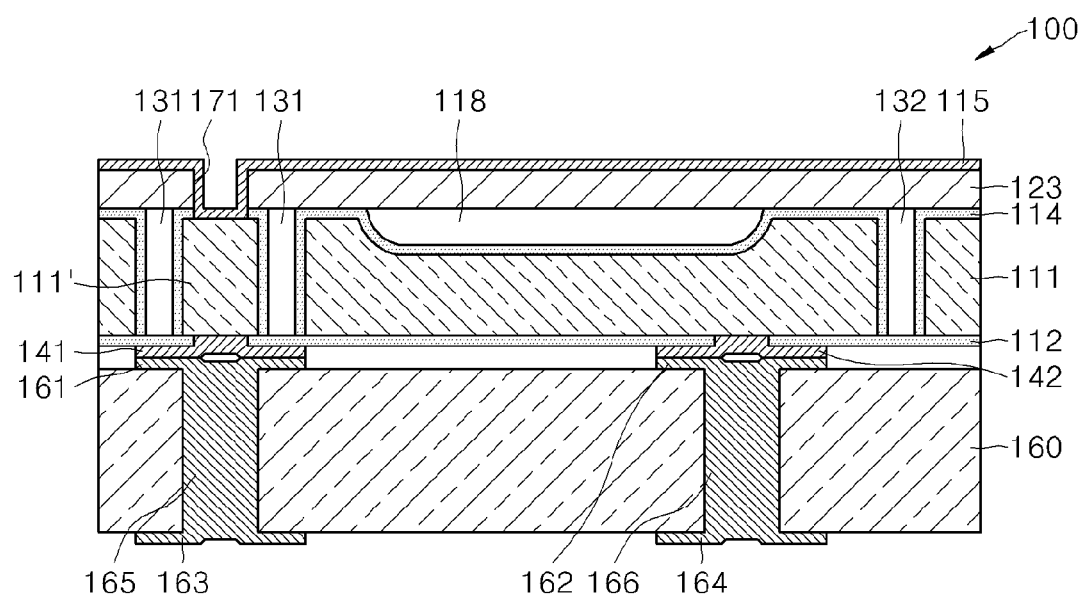
FIG. 1 is a cross-sectional view of an electro-acoustic transducer according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

The present exemplary embodiments may have different forms and should not be construed as being limited to the descriptions set forth herein. Sizes of elements in the drawings may be exaggerated for convenience of explanation.

It will be understood that when a predetermined material layer is referred to as being "formed on" a substrate or another layer, the predetermined material layer can be directly or indirectly formed on the substrate or the other layer. That is, an intervening layer may be present between the predetermined layer and the substrate or the other layer. It will be understood that respective materials consisting layers of the exemplary embodiments described below are merely provided as examples, and accordingly, other materials may be used. A typical example of an electro-acoustic transducer described below is a capacitive micro-machined ultrasonic transducer (cMUT), but is not necessarily limited thereto.

Expressions such as "at least one of," when preceding a list of elements, modify the entire list of elements and do not modify the individual elements of the list.

FIG. 1 is a cross-sectional view of an electro-acoustic transducer 100 according to an exemplary embodiment.

Referring to FIG. 1, the electro-acoustic transducer 100 may include a plurality of elements that are arrayed two-dimensionally. Each of the elements may include at least one cavity 118. One cavity 118 is only shown in FIG. 1 for convenience of illustration. The electro-acoustic transducer 100 includes a conductive substrate 111 in which the cavity 118 is formed, a membrane 123 provided on the conductive substrate 111, and an upper electrode 115 provided on the membrane 123.

The conductive substrate 111 acts as a lower electrode, and may include, for example, low resistivity silicon. In this regard, the low resistivity silicon may have, for example, a specific electrical resistance of about 0.01 Ωcm or less, but is not limited thereto. The conductive substrate 111 may be formed of various conductive materials. The cavity 118 of a predetermined depth is formed in an upper surface of the conductive substrate 111. A first trench 131 is formed in the conductive substrate 111. The conductive substrate 111 surrounded by the first trench 131 constitutes an electrode connection unit 111'. A second trench 132 may be further formed in the conductive substrate 111 so as to separate the elements.

A first insulating layer 112 is provided on a lower surface of the conductive substrate 111. The first insulating layer 112 may include, for example, a silicon oxide, but is not limited thereto. First and second electrodes 141 and 142 that contact a lower surface of the electrode connection unit 111' and the lower surface of the conductive substrate 111 are provided on the first insulating layer 112. Accordingly, the first electrode 141 is electrically connected to the electrode connection unit 111', and the second electrode 142 is electrically connected to the conductive substrate 111. In this regard, the first electrode 141 may be a common ground electrode, and the second electrode 142 may be a signal electrode. Alternatively, the first electrode 141 may be a signal electrode, and the second electrode 142 may be the common ground electrode.

The first and second electrodes 141 and 142 may include at least one metal material of, for example, Au, Cu, and Sn, but are not limited thereto. The first and second electrodes 141 and 142 may have a monolayer or multilayer structure. A second insulating layer 114 is provided on the surface of the conductive substrate 111 including an inner surface of the cavity 118 and inner surfaces of the first and second trenches 131 and 132. In this regard, the second insulating layer 114 may include, for example, a silicon oxide, but is not limited thereto.

The membrane 123 is provided on the conductive substrate 111 to cover the cavity 118. The membrane 123 may include, for example, silicon, but is not limited thereto. A via hole 171 is formed in the membrane 123 and the second insulating layer 114 to expose an upper surface of the electrode connection unit 111'. The upper electrode 115 is provided on the membrane 123. In this regard, the upper electrode 115 is provided to contact the upper surface of the electrode connection unit 111' via the via hole 171. Accordingly, the upper electrode 115 is electrically connected to the electrode connection unit 111'. The upper electrode 115 may be formed of a metal material including at least one of, for example, Au and Cu. However, this is merely an example, and the upper electrode 115 may be formed of various other conductive materials.

A pad substrate 160 is provided on the lower surface of the conductive substrate 111. The pad substrate 160 may include, for example, silicon, but is not limited thereto. A plurality of pads that are electrically connected to the first and second electrodes 141 and 142 are provided on the pad substrate 160. In more detail, first and second upper pads 161 and 162 that are bonded to the first and second electrodes 141 and 142 are provided on an upper surface of the pad substrate 160. The first and second upper pads 161 and 162 may include at least one metal material of, for example, Au, Cu, and Sn, but are not limited thereto. The first and second upper pads 161 and 162 may have a monolayer or multilayer structure.

Bonding between the first electrode 141 and the first upper pad 161 and bonding between the second electrode 142 and the second upper pad 162 may be performed by eutectic bonding. In this case, the first and second electrodes 141 and 142 may include at least one of Au and Cu, and the first and second upper pads 161 and 162 may include Sn and at least one of Au and Cu. Alternatively, the first and second electrodes 141 and 142 may include Sn and at least one of Au and Cu, and the first and second upper pads 161 and 162 may include at least one of Au and Cu. For example, when the first electrode 141 includes an Au layer, and the first upper pad 161 includes an Au/Sn layer, if the first electrode 141 and the first upper pad 161 are eutectically bonded, an Au—Sn eutectic alloy may be formed on an interface between the first electrode 141 and the first upper pad 161. Meanwhile, bonding between the first electrode 141 and the first upper pad 161 and bonding between the second electrode 142 and the second upper pad 162 may be performed by a bonding method other than the eutectic bonding.

First and second lower pads 163 and 164 that are electrically connected to the first and second upper pads 161 and 162 respectively may be formed on the lower surface of the pad substrate 160. A first conductive filler 165 used to electrically connect the first upper pad 161 and the first lower pad 163, and a second conductive filler 166 used to electrically connect the second upper pad 162 and the second lower pad 164 are provided inside the pad substrate 160. In this regard, the first and second lower pads 163 and 164 may include the same conductive material as that of the first and second upper pads 161 and 162, but are not necessarily limited thereto.

As described above, the cavity 118 and the first and second trenches 131 and 312 are formed in the conductive substrate 111, and the conductive substrate 111 surrounded by the first trench 131 constitutes the electrode connection unit 111'. In this regard, the first electrode 141 is provided to contact the lower surface of the electrode connection unit 111', and the upper electrode 115 is provided to contact the upper surface of the electrode connection unit 111'. Accordingly, an electrical signal applied to the first electrode 141 may be transmitted to the upper electrode 115 through the electrode connection unit 111' of the conductive substrate 111.

Figure 2:
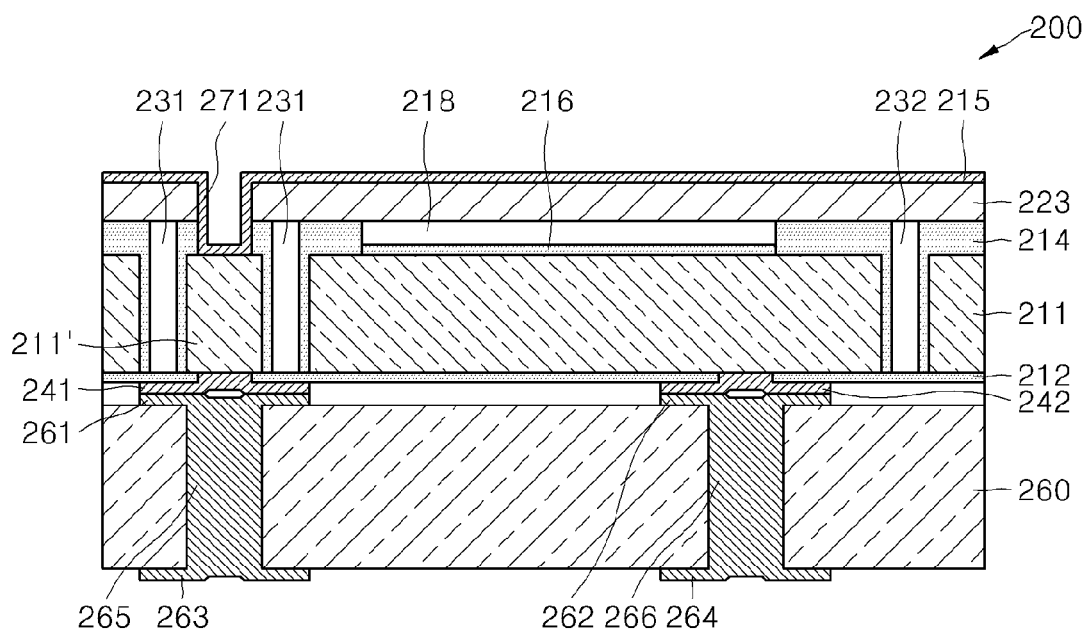
FIG. 2 is a cross-sectional view of an electro-acoustic transducer according to another exemplary embodiment.

FIG. 2 is a cross-sectional view of an electro-acoustic transducer 200 according to another exemplary embodiment. The differences between exemplary embodiments of FIGS. 1 and 2 will now be described below.

Referring to FIG. 2, the electro-acoustic transducer 200 may include a plurality of elements that are arrayed two-dimensionally. Each of the elements may include at least one cavity 218. The electro-acoustic transducer 200 includes a conductive substrate 211, a support 214 provided on the conductive substrate 211 and including the cavity 218, a membrane 223 provided on the support 214, and an upper electrode 215 provided on the membrane 223.

The conductive substrate 211 acts as a lower electrode, and may include, for example, low resistivity silicon having a specific electrical resistance of about 0.01 Ωcm or less, but is not limited thereto. A first trench 231 is formed in the conductive substrate 211. The conductive substrate 211 surrounded by the first trench 231 constitutes an electrode connection unit 211'. A second trench 232 may be further formed in the conductive substrate 211 so as to separate the elements. A first insulating layer 212 including, for example, a silicon oxide, is provided on a lower surface of the conductive substrate 211.

First and second electrodes 241 and 242 that contact a lower surface of the electrode connection unit 211' and the lower surface of the conductive substrate 211 are provided on the first insulating layer 212. Accordingly, the first electrode 241 is electrically connected to the electrode connection unit 211', and the second electrode 242 is electrically connected to the conductive substrate 211. The first and second electrodes 241 and 242 may include at least one metal material of, for example, Au, Cu, and Sn, but are not limited thereto. The first and second electrodes 141 and 142 may have a monolayer or multilayer structure.

A support 214 is provided on a surface of the conductive substrate 211 including inner surfaces of the first and second trenches 231 and 232. The support 214 is provided to have a predetermined height on an upper surface of the conductive substrate 211. The cavity 218 is formed inside the support 214. The support 214 may include, for example, a silicon oxide, but is not limited thereto. A second insulating layer 216 including, for example, a silicon oxide, is provided on the upper surface of the conductive substrate 211 that forms a bottom surface of the cavity 218. The membrane 223 is provided on the support 214 to cover the cavity 218. The membrane 223 may include, for example, silicon, but is not limited thereto. A via hole 271 is formed in the membrane 223 and the support 214 to expose an upper surface of the electrode connection unit 211'. The upper electrode 215 is provided on the membrane 223. In this regard, the upper electrode 215 is provided to contact the upper surface of the electrode connection unit 211' via the via hole 271. Accordingly, the upper electrode 215 is electrically connected to the electrode connection unit 211'.

A pad substrate 260 is provided on the lower surface of the conductive substrate 211. First and second upper pads 261 and 262 that are bonded to the first and second electrodes 241 and 242 are provided on an upper surface of the pad substrate 260. The first and second upper pads 261 and 262 may include at least one metal material of, for example, Au, Cu, and Sn, but are not limited thereto. The first and second upper pads 261 and 262 may have a monolayer or multilayer structure. Bonding between the first electrode 241 and the first upper pad 261 and bonding between the second electrode 242 and the second upper pad 262 may be performed by eutectic bonding. Meanwhile, bonding between the first electrode 241 and the first upper pad 261 and bonding between the second electrode 242 and the second upper pad 262 may be performed by a bonding method other than the eutectic bonding. First and second lower pads 263 and 264 that are electrically connected to the first and second upper pads 261 and 262 respectively may be formed on the lower surface of the pad substrate 260. A first conductive filler 265 used to electrically connect the first upper pad 261 and the first lower pad 263, and a second conductive filler 266 used to electrically connect the second upper pad 262 and the second lower pad 264 are provided inside the pad substrate 260. In this regard, the first and second lower pads 263 and 264 may include the same conductive material as that of the first and second upper pads 261 and 262, but are not necessarily limited thereto.

As described above, the first and second trenches 231 and 232 are formed in the conductive substrate 211, and the conductive substrate 211 surrounded by the first trench 231 constitutes the electrode connection unit 211'. In this regard, the first electrode 241 is provided to contact the lower surface of the electrode connection unit 211', and the upper electrode 215 is provided to contact the upper surface of the electrode connection unit 211'. Accordingly, an electrical signal applied to the first electrode 241 may be transmitted to the upper electrode 215 through the electrode connection unit 211' of the conductive substrate 211.

FIGS. 3 through 15 are diagrams for explaining a method of manufacturing an electro-acoustic transducer according to an exemplary embodiment. In more detail, FIGS. 3 through 15 are diagrams for explaining a method of manufacturing the electro-acoustic transducer 100 of FIG. 1.

Figure 3:
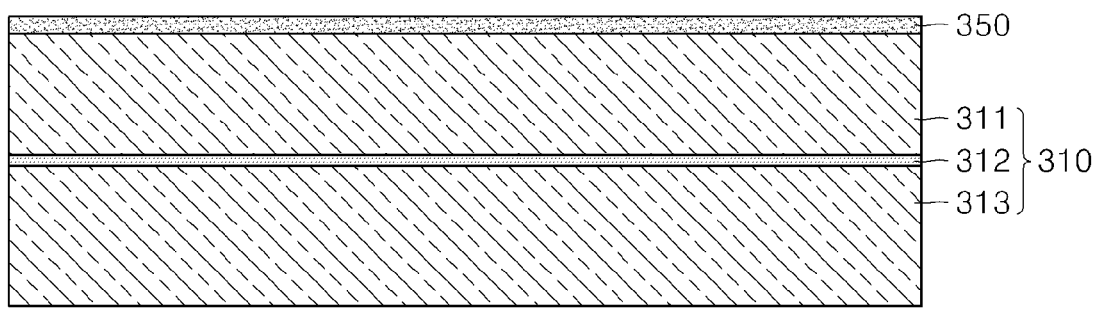
FIGS. 3, 4, 5, 6, 7, 8, 9, 10, 11, 12, 13, 14 and 15 are diagrams for explaining a method of manufacturing an electro-acoustic transducer according to an exemplary embodiment.

Referring to FIG. 3, a first wafer 310 including a first substrate 311, a first insulating layer 312, and a second substrate 313 is prepared. In this regard, the first substrate 311 may include a conductive material. For example, the first substrate 311 may include low resistivity silicon having a specific electrical resistance of about 0.01 Ωcm or less, but is not limited thereto. The first insulating layer 312 may include, for example, a silicon oxide, but is not limited thereto. The second substrate 313 may include silicon, but is not limited thereto. The first wafer 310 may use, for example, a silicon on insulator (SOI) wafer. Thereafter, a passivation layer 350 is formed on an upper surface of the first substrate 311. The passivation layer 350 may include at least one of, for example, a silicon oxide and a silicon nitride, but is not limited thereto.

Figure 4:
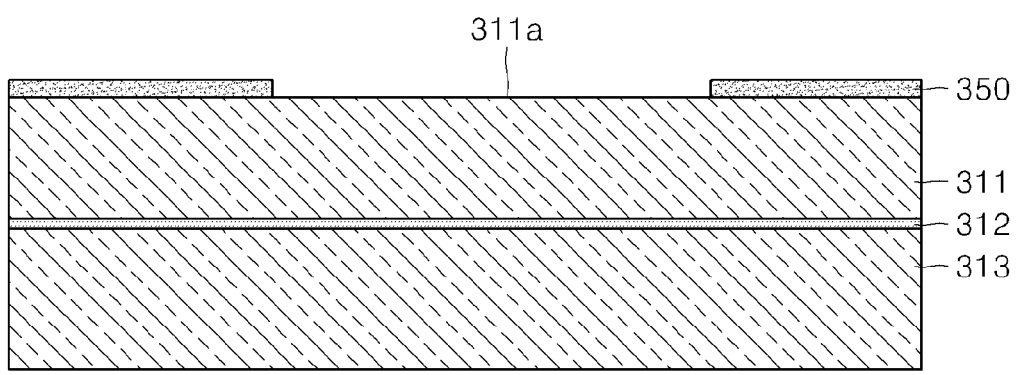

Referring to FIG. 4, the passivation layer 350 is patterned to partially expose the upper surface of the first substrate 311, thereby forming a cavity forming region 311a.

Figure 5:
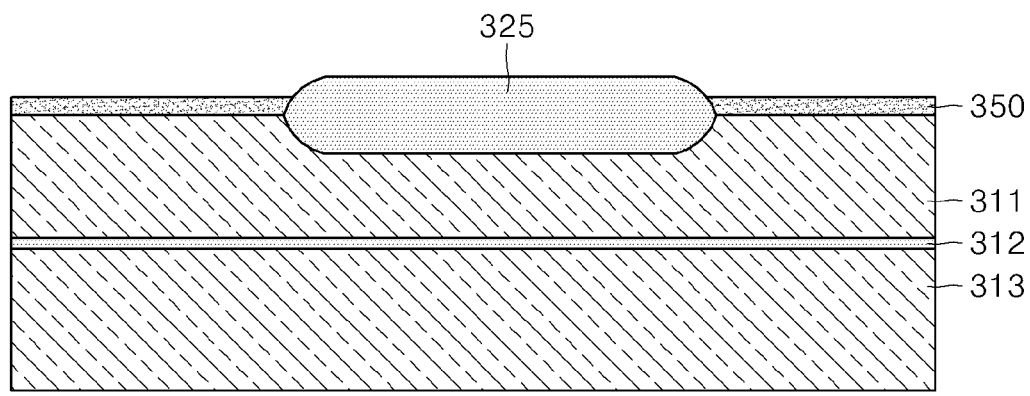

Referring to FIG. 5, the cavity forming region 311a is oxidized to form an oxide layer 325. In this regard, the oxide layer 325 may be formed to have a predetermined depth from the upper surface of the first substrate 311.

Figure 6:
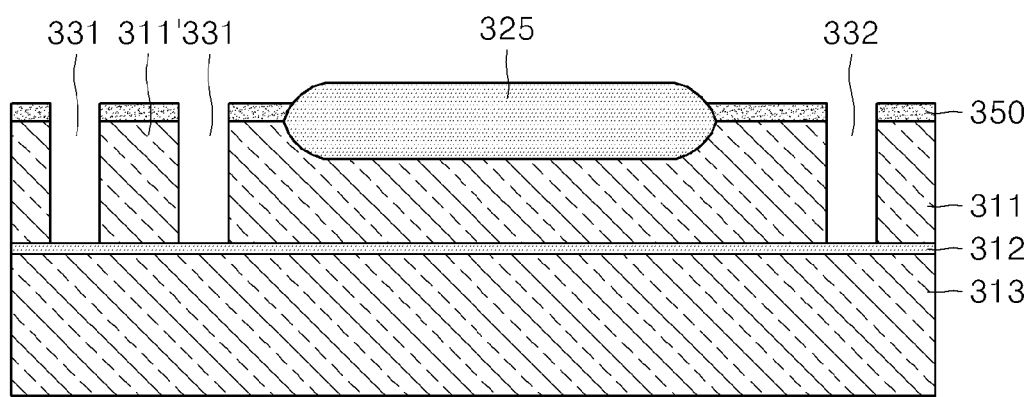

Referring to FIG. 6, a first trench 331 and a second trench 332 are formed in the first substrate 311. The first trench 331 is used to form an electrode connection unit 311' on the first substrate 311. The second trench 332 is used to separate elements. The first and second trenches 331 and 332 may be formed by patterning the passivation layer 350 and etching the upper surface of the first substrate 311 exposed by the patterned passivation layer 350 until the first insulating layer 312 is exposed. Accordingly, the first substrate 311 surrounded by the first trench 331 may constitute the electrode connection unit 311'.

Figure 7:
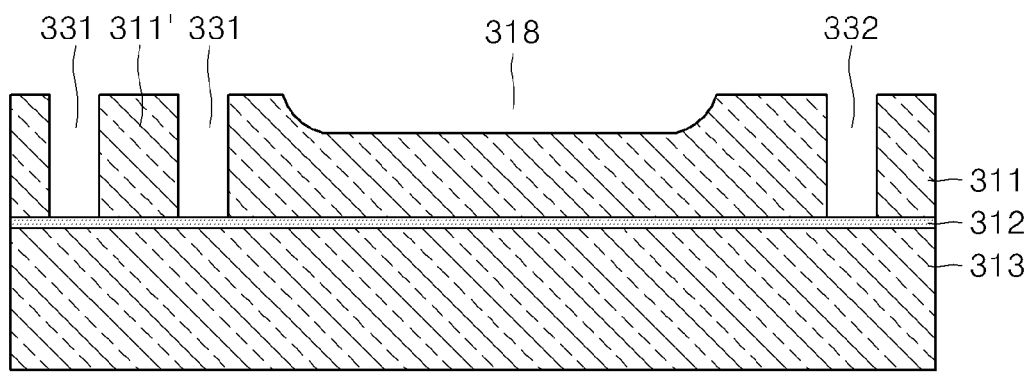

Referring to FIG. 7, the passivation layer 350 and the oxide layer 325 are removed from the first substrate 311. The oxide layer 325 is removed from the first substrate 311 so that a cavity 318 is formed to have a predetermined depth in the upper surface of the first substrate 311.

Figure 8:
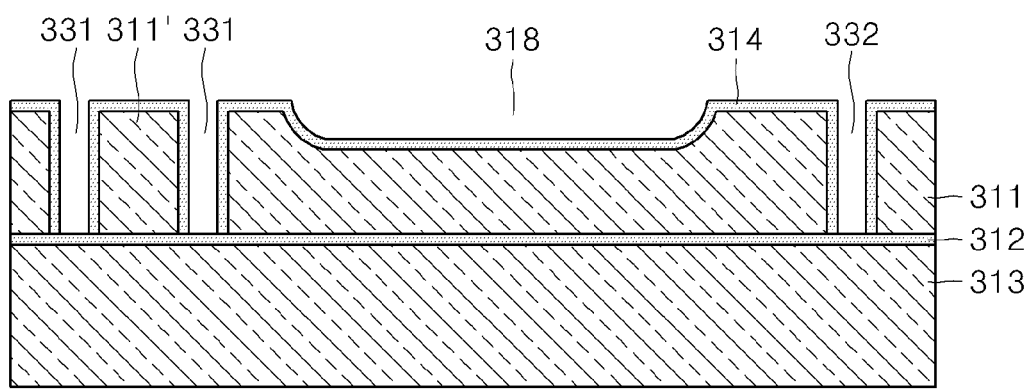

Referring to FIG. 8, a second insulating layer 314 is formed on a surface of the first substrate 311 including inner surfaces of the first and second trenches 331 and 332 and inner surfaces of the cavity 318. The second insulating layer 314 may include, for example, a silicon oxide, but is not limited thereto.

Figure 9:
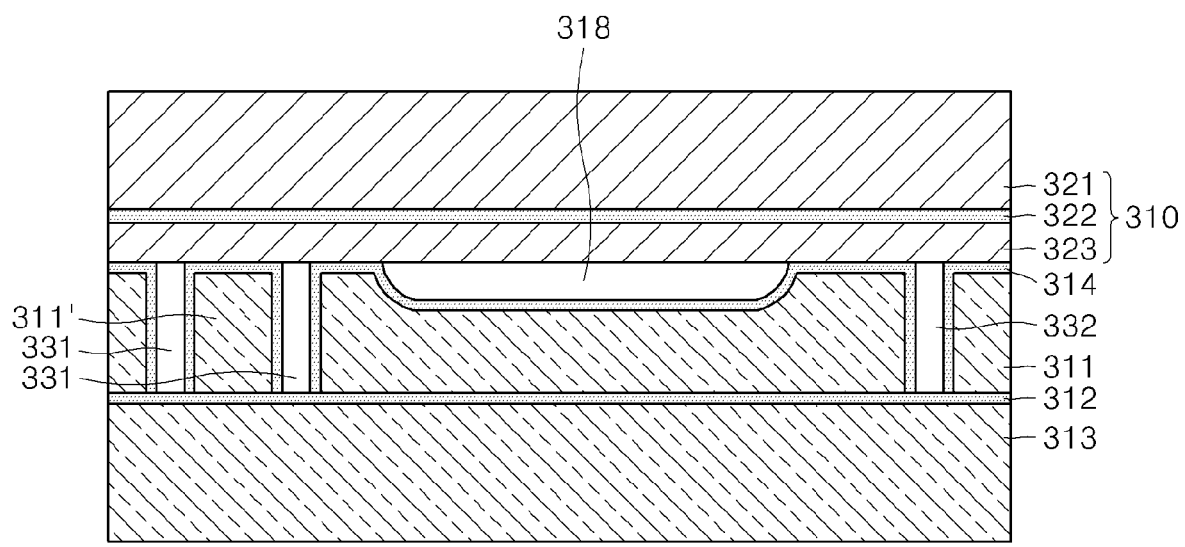

Referring to FIG. 9, a second wafer 320 including a third substrate 321, a third insulating layer 322, and a fourth substrate 323 is prepared. The third and fourth substrates 321 and 323 may include, for example, silicon, and the third insulating layer 322 may include a silicon oxide, but are not limited thereto. The second wafer 320 may use, for example, an SOI wafer. Thereafter, the fourth substrate 323 of the second wafer 320 is bonded to the upper surface of the first substrate 311. Bonding between the first substrate 311 and the fourth substrate 323 may be performed by, for example, silicon direct bonding (SDB), but is not limited thereto.

Figure 10:
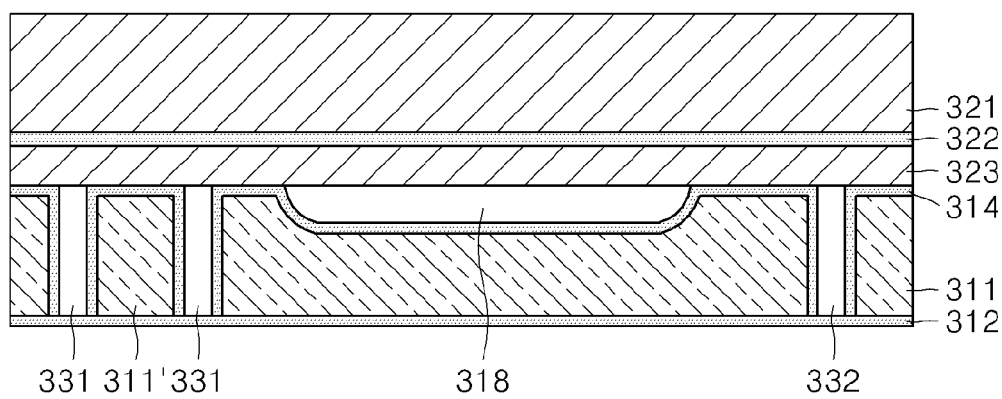

Referring to FIG. 10, the second substrate 313 is removed.

Figure 11:
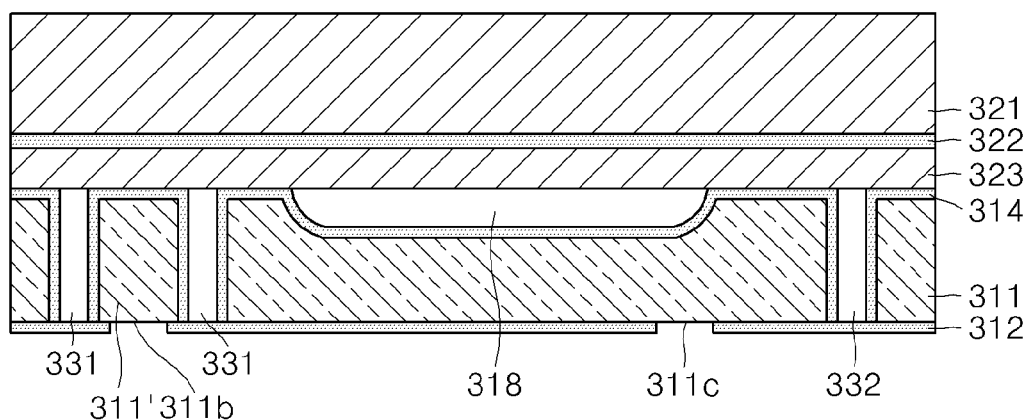

Thereafter, referring to FIG. 11, the first insulating layer 312 is patterned to partially expose a lower surface of the electrode connection unit 311' and a lower surface of the first substrate 311.

Figure 12:
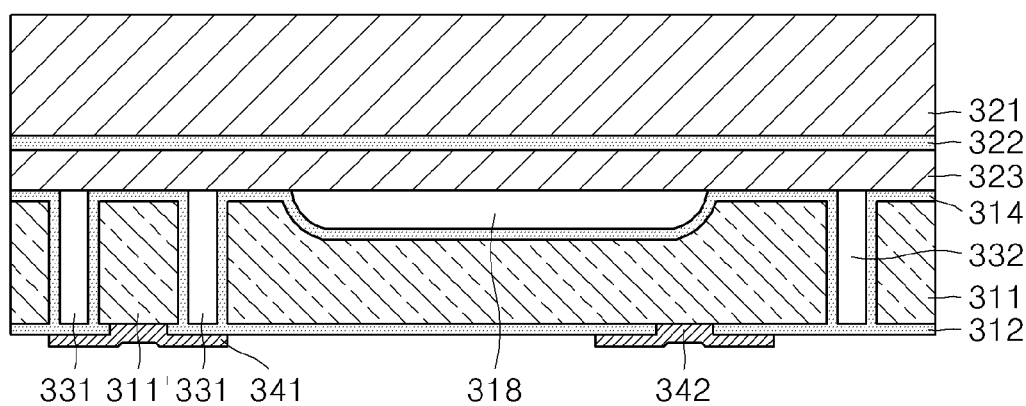

Next, referring to FIG. 12, first and second electrodes 341 and 342 are formed on the first insulating layer 312 to contact the lower surface of the electrode connection unit 311' and the lower surface of the first substrate 311. In this regard, the second electrode 342 is disposed on the lower surface of the first substrate 311 and spaced apart from the first substrate 341 by a predetermined gap. Accordingly, the first electrode 341 is electrically connected to the electrode connection unit 311', and the second electrode 342 is electrically connected to the first substrate 311. The first and second electrodes 341 and 342 may include at least one metal material of, for example, Au, Cu, and Sn, but are not limited thereto. The first and second electrodes 341 and 342 may have a monolayer or multilayer structure.

Figure 13:
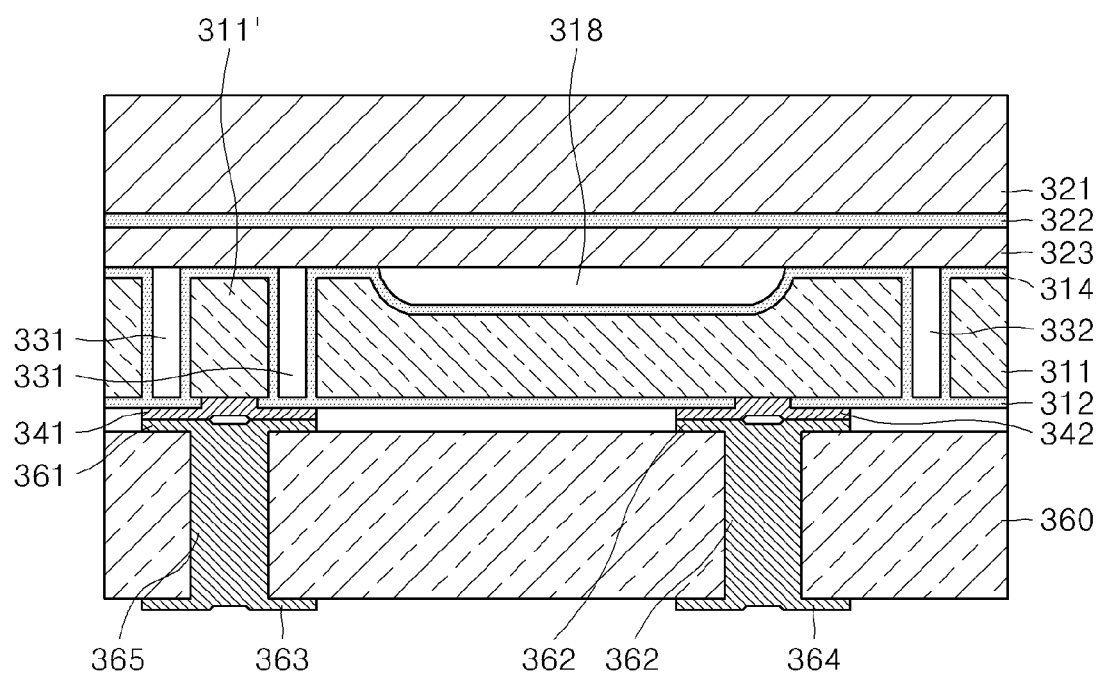

Referring to FIG. 13, a pad substrate 360 is coupled to the first substrate 311. The first and second upper pads 361 and 362 that are bonded to the first and second electrodes 341 and 342 are provided on an upper surface of the pad substrate 360. In this regard, the first and second upper pads 361 and 362 may include at least metal material of, for example, Au, Cu, and Sn, but are not limited thereto. The first and second upper pads 361 and 362 may have a monolayer or multilayer structure.

Bonding between the first electrode 341 and the first upper pad 361 and bonding between the second electrode 342 and the second upper pad 362 may be performed by eutectic bonding. In this case, the first and second electrodes 341 and 342 may include at least one of Au and Cu, and the first and second upper pads 361 and 362 may include Sn and at least one of Au and Cu. Alternatively, the first and second electrodes 341 and 342 may include Sn and at least one of Au and Cu, and the first and second upper pads 361 and 362 may include at least one of Au and Cu. For example, when the first electrode 341 includes an Au layer, and the first upper pad 361 includes an Au/Sn layer, if the first electrode 341 and the first upper pad 361 are eutectically bonded, an Au—Sn eutectic alloy may be formed on an interface between the first electrode 341 and the first upper pad 361. Meanwhile, bonding between the first electrode 341 and the first upper pad 361 and bonding between the second electrode 342 and the second upper pad 362 may be performed by a bonding method other than the eutectic bonding.

First and second lower pads 363 and 364 that are electrically connected to the first and second upper pads 361 and 362 respectively may be provided on a lower surface of the pad substrate 360. A first conductive filler 365 used to electrically connect the first upper pad 361 and the first lower pad 363, and a second conductive filler 366 used to electrically connect the second upper pad 362 and the second lower pad 364 are provided inside the pad substrate 360. In this regard, the first and second lower pads 363 and 364 may include the same conductive material as that of the first and second upper pads 361 and 362, but are not necessarily limited thereto.

Figure 14:
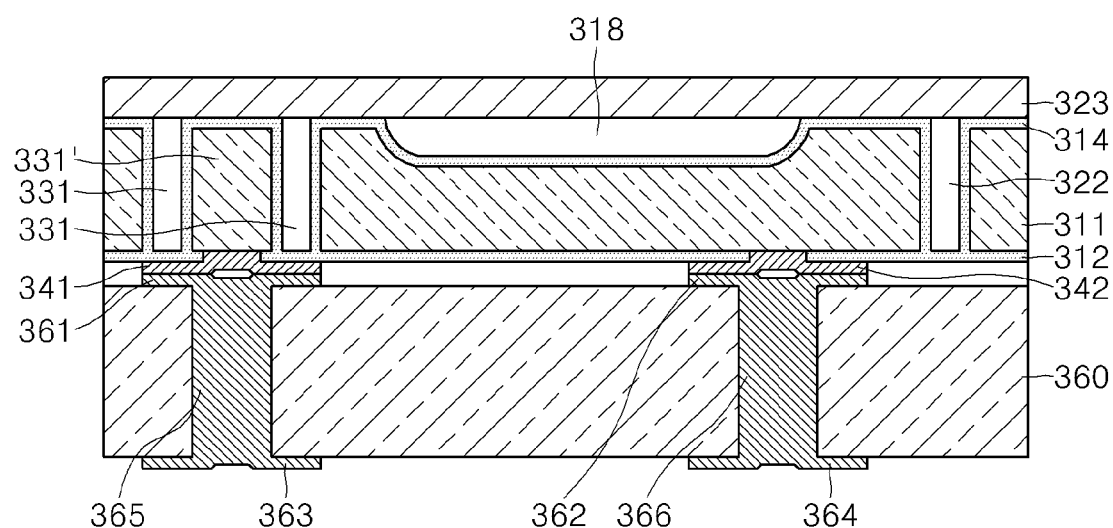

Referring to FIG. 14, the third substrate 321 and the third insulating layer 322 are removed. Accordingly, the fourth substrate 323 constitutes a membrane.

Figure 15:
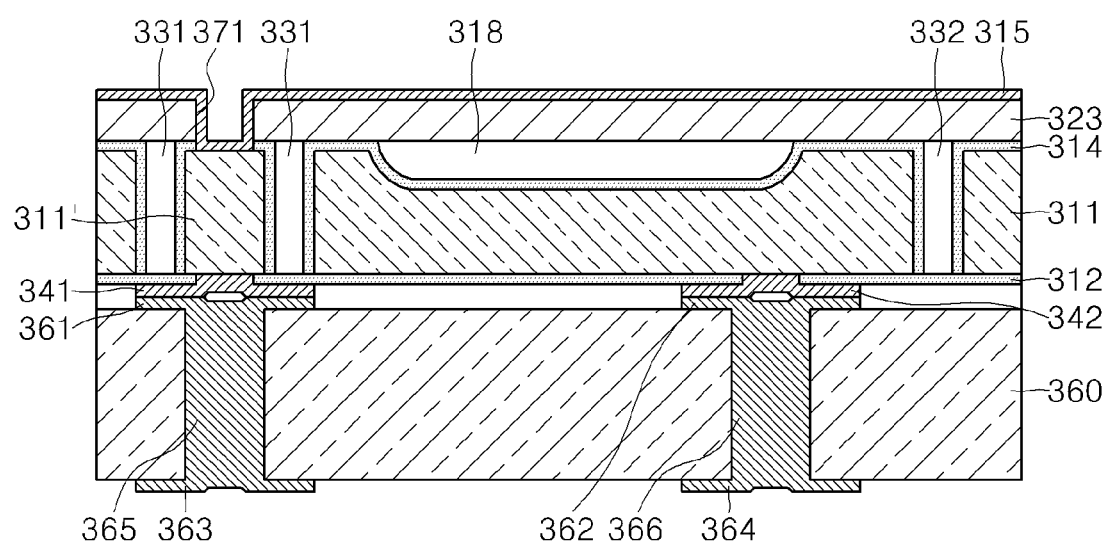

Thereafter, referring to FIG. 15, the fourth substrate 323 and the second insulating layer 314 are etched to form a via hole 371 that exposes the upper surface of the electrode connection unit 311'. Thereafter, an upper electrode 315 is formed on an upper surface of the fourth substrate 323. In this regard, the upper electrode 315 is formed to contact the upper surface of the electrode connection unit 311' through the via hole 371 so that the upper electrode 315 is electrically connected to the electrode connection unit 311'.

According to the method of manufacturing the electro-acoustic transducer as described above, the first trench 331 is formed in the first substrate 311, thereby forming the electrode connection unit 311' that electrically connects the first electrode 341 and the upper electrode 315 through a relatively simple process. Two SOI wafers are bonded to manufacture the electro-acoustic transducer, which does not need a chemical mechanical polishing (CMP) process or an aligning process of a substrate, thereby simplifying a manufacturing process.

FIGS. 16 through 27 are diagrams for explaining a method of manufacturing an electro-acoustic transducer according to another exemplary embodiment. In more detail, FIGS. 16 through 27 are diagrams for explaining a method of manufacturing the electro-acoustic transducer 200 of FIG. 2.

Figure 16:
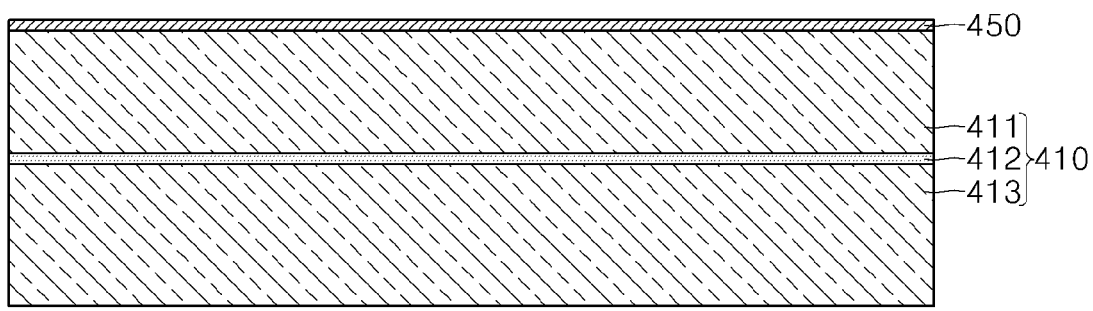
FIGS. 16, 17, 18, 19, 20, 21, 22, 23, 24, 25, 26, and 27 are diagrams for explaining a method of manufacturing an electro-acoustic transducer according to an exemplary embodiment.

Referring to FIG. 16, a first wafer 410 including a first substrate 411, a first insulating layer 412, and a second substrate 413 is prepared. In this regard, the first substrate 411 may include a conductive material. For example, the first substrate 411 may include low resistivity silicon having a specific electrical resistance of about 0.01 Ωcm or less, but is not limited thereto. The first insulating layer 412 may include, for example, a silicon oxide, but is not limited thereto. The second substrate 413 may include silicon, but is not limited thereto. The first wafer 410 may use, for example, a SOI wafer. Thereafter, a passivation layer 450 is formed on an upper surface of the first substrate 411. The passivation layer 450 may include at least one of, for example, a silicon oxide and a silicon nitride, but is not limited thereto. The passivation layer 450 may have a monolayer or multilayer structure.

Figure 17:
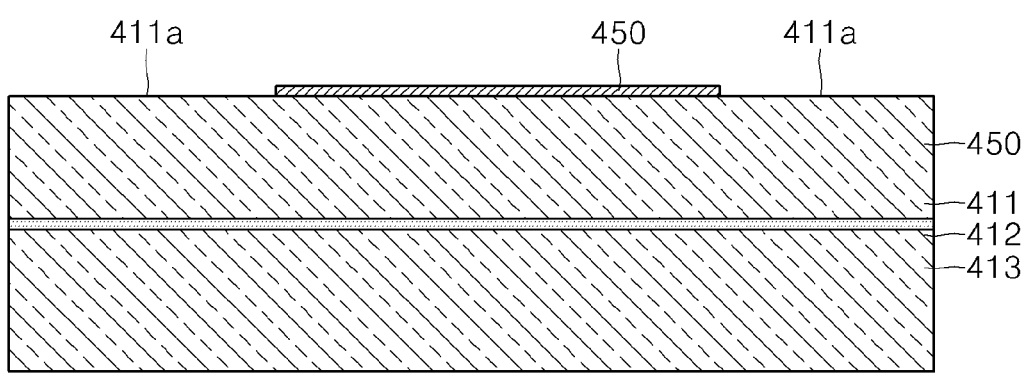

Referring to FIG. 17, the passivation layer 450 is patterned to partially expose the upper surface of the first substrate 411, thereby forming a trench forming region 411a.

Figure 18:
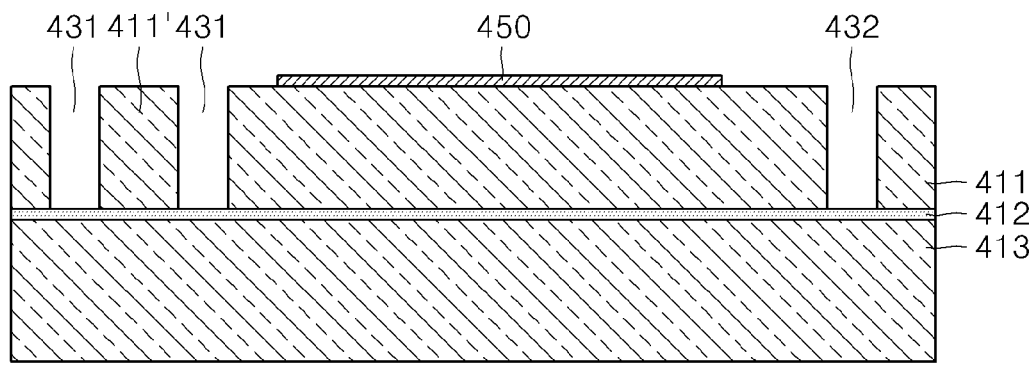

Referring to FIG. 18, the trench forming region 411a is etched to form first and second trenches 431 and 432. The first trench 431 is used to form an electrode connection unit 411' on the first substrate 411. The second trench 432 is used to separate elements. The first and second trenches 431 and 432 may be formed by etching an upper surface of the first substrate 411 until the first insulating layer 412 is exposed. Accordingly, the first substrate 411 surrounded by the first trench 431 may constitute the electrode connection unit 411'.

Figure 19:
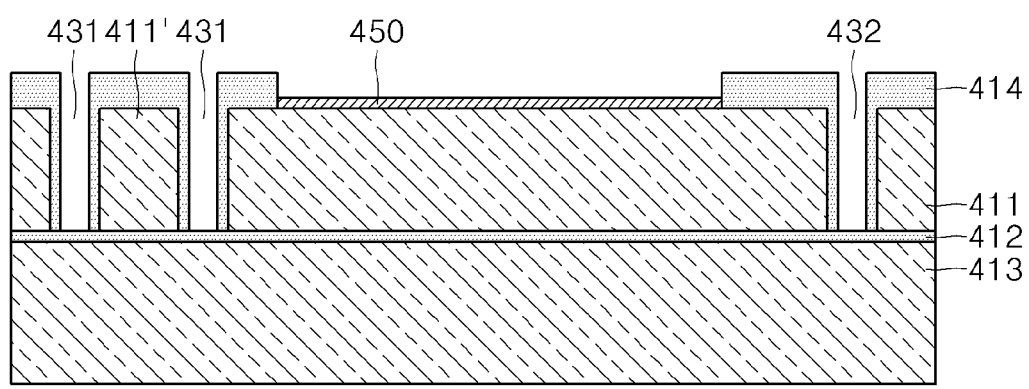

Referring to FIG. 19, a support 414 is formed on an exposed surface of the first substrate 411 including inner surfaces of the first and second trenches 431 and 432. The support 414 may be formed by oxidizing the surface of the first substrate 411. The support 414 may include, for example, a silicon oxide, but is not limited thereto. The support 414 may be formed to have a predetermined height on an upper surface of the first substrate 411.

Figure 20:
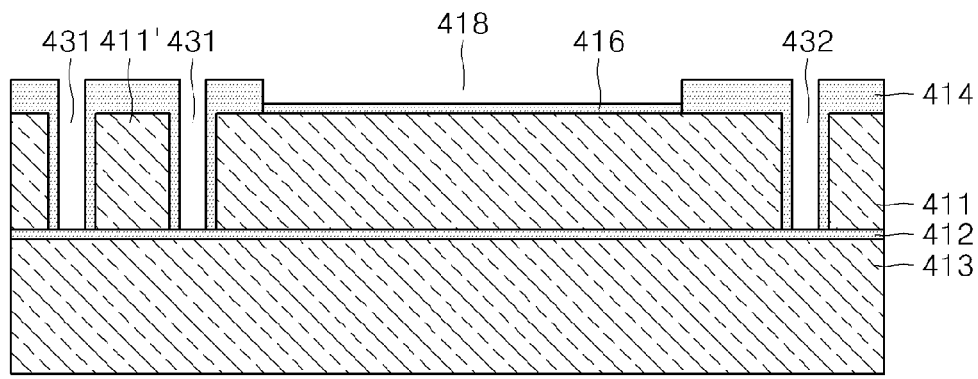

Referring to FIG. 20, the passivation layer 450 that remains on the upper surface of the first substrate 411 is removed. Accordingly, a cavity 418 is formed inside the support 414. A second insulating layer 416 may be formed on the upper surface of the first substrate 411 that forms a bottom surface of the cavity 418. In this regard, the second insulating layer 416 may be formed by removing a partial layer of the passivation layer 450 including multilayers. Alternatively, the second insulating layer 416 may be formed by entirely removing the passivation layer 450 and then oxidizing the surface of the first substrate 411.

Figure 21:
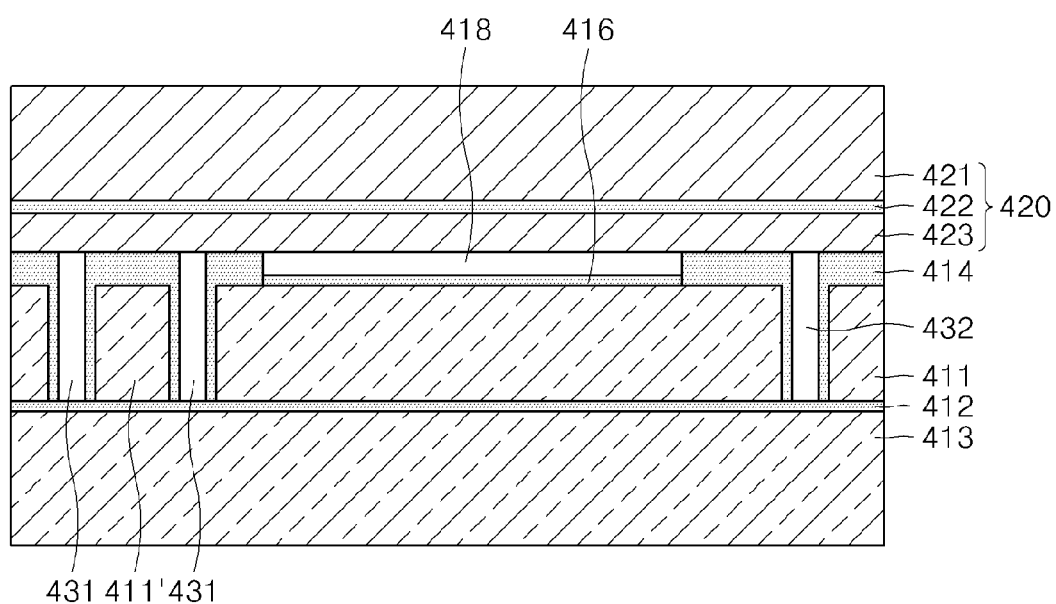

Referring to FIG. 21, a second wafer 420 including a third substrate 421, a third insulating layer 422, and a fourth substrate 423 is prepared. The third and fourth substrates 421 and 423 may include, for example, silicon, and the third insulating layer 422 may include a silicon oxide, but are not limited thereto. The second wafer 420 may use, for example, an SOI wafer. Thereafter, the fourth substrate 423 of the second wafer 420 is bonded to the upper surface of the first substrate 411. Bonding between the first substrate 411 and the fourth substrate 423 may be performed by, for example, SDB, but is not limited thereto.

Figure 22:
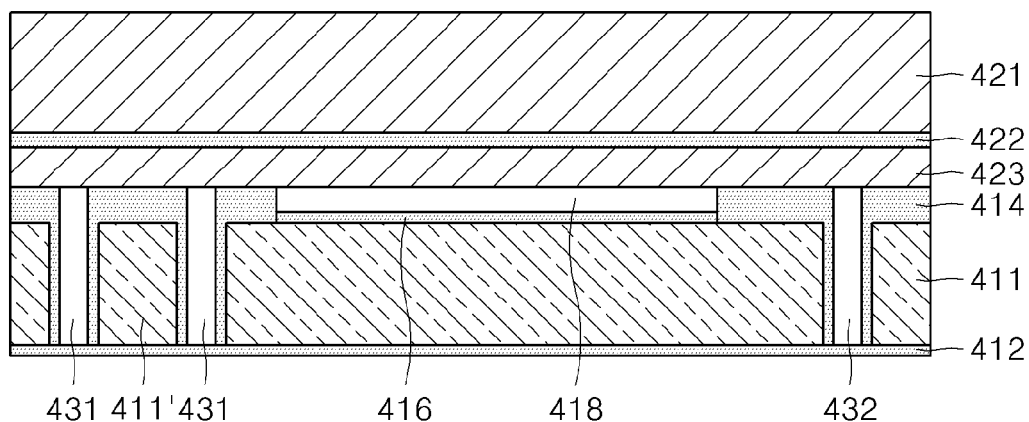

Referring to FIG. 22, the second substrate 413 is removed.

Figure 23:
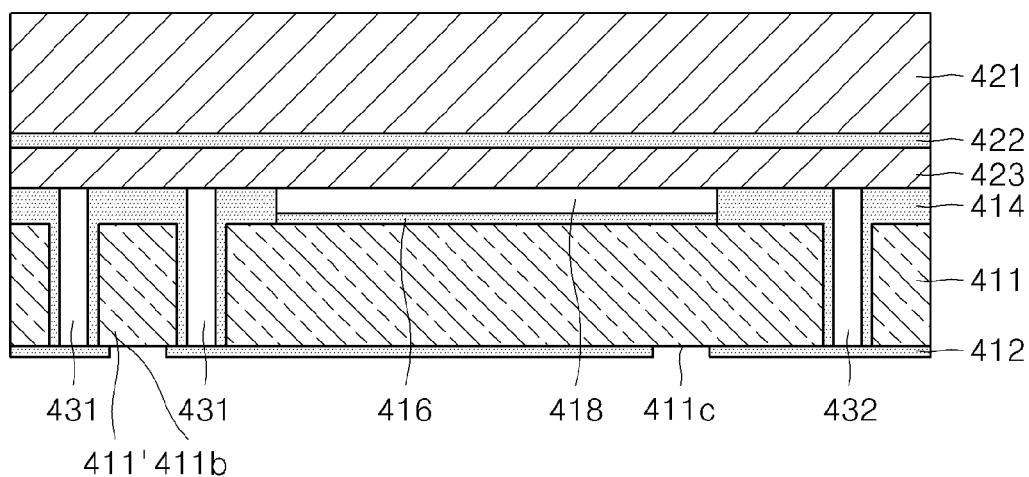

Thereafter, referring to FIG. 23, the first insulating layer 412 is patterned to partially expose a lower surface of the electrode connection unit 411' and a lower surface of the first substrate 411.

Figure 24:
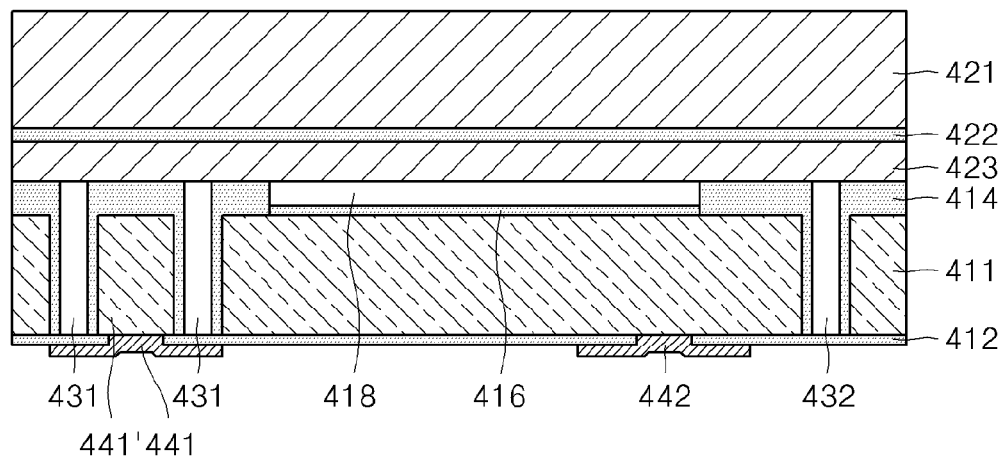

Next, referring to FIG. 24, first and second electrodes 441 and 442 are formed on the first insulating layer 412 to contact the lower surface of the electrode connection unit 411' and the lower surface of the first substrate 411. Accordingly, the first electrode 441 is electrically connected to the electrode connection unit 411', and the second electrode 442 is electrically connected to the first substrate 411. The first and second electrodes 441 and 442 may include at least one metal material of, for example, Au, Cu, and Sn, but are not limited thereto. The first and second electrodes 441 and 442 may have a monolayer or multilayer structure.

Figure 25:
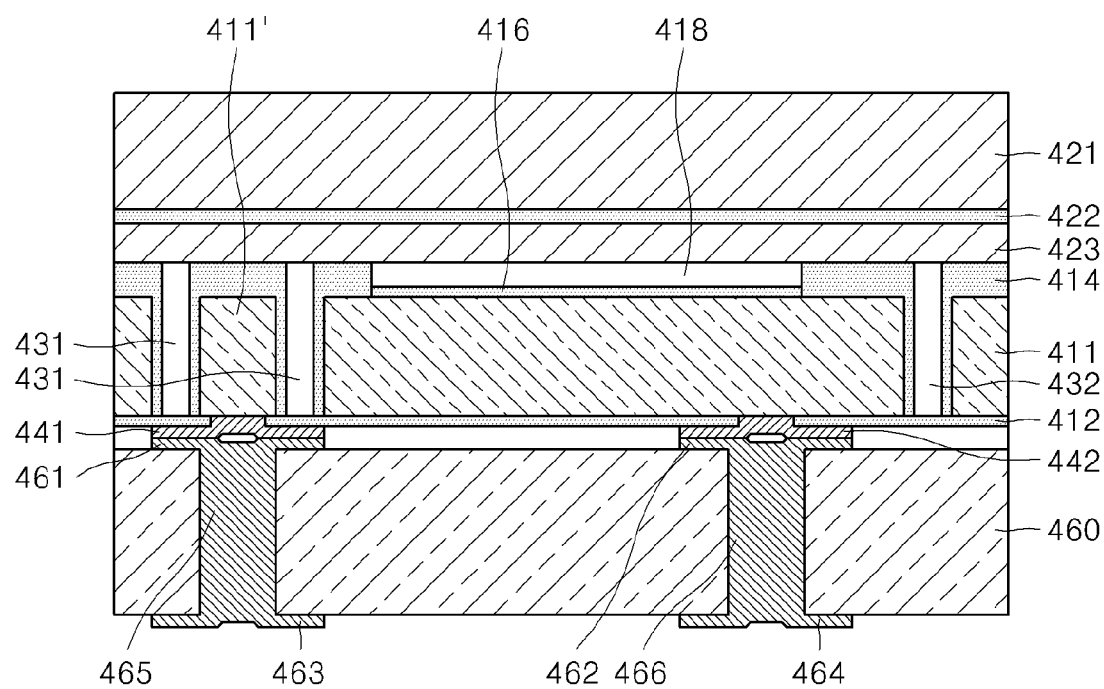

Referring to FIG. 25, a pad substrate 460 is coupled to the first substrate 411. The first and second upper pads 461 and 462 that are bonded to the first and second electrodes 441 and 442 are provided on an upper surface of the pad substrate 460. In this regard, the first and second upper pads 461 and 462 may include at least metal material of, for example, Au, Cu, and Sn, but are not limited thereto. The first and second upper pads 461 and 462 may have a monolayer or multilayer structure. Bonding between the first electrode 441 and the first upper pad 461 and bonding between the second electrode 442 and the second upper pad 462 may be performed by eutectic bonding. Meanwhile, bonding between the first electrode 441 and the first upper pad 461 and bonding between the second electrode 442 and the second upper pad 462 may be performed by a bonding method other than the eutectic bonding. First and second lower pads 463 and 464 that are electrically connected to the first and second upper pads 461 and 462 respectively may be provided on a lower surface of the pad substrate 460. A first conductive filler 465 used to electrically connect the first upper pad 461 and the first lower pad 463, and a second conductive filler 466 used to electrically connect the second upper pad 462 and the second lower pad 464 are provided inside the pad substrate 460. In this regard, the first and second lower pads 463 and 464 may include the same conductive material as that of the first and second upper pads 461 and 462, but are not necessarily limited thereto.

Figure 26:
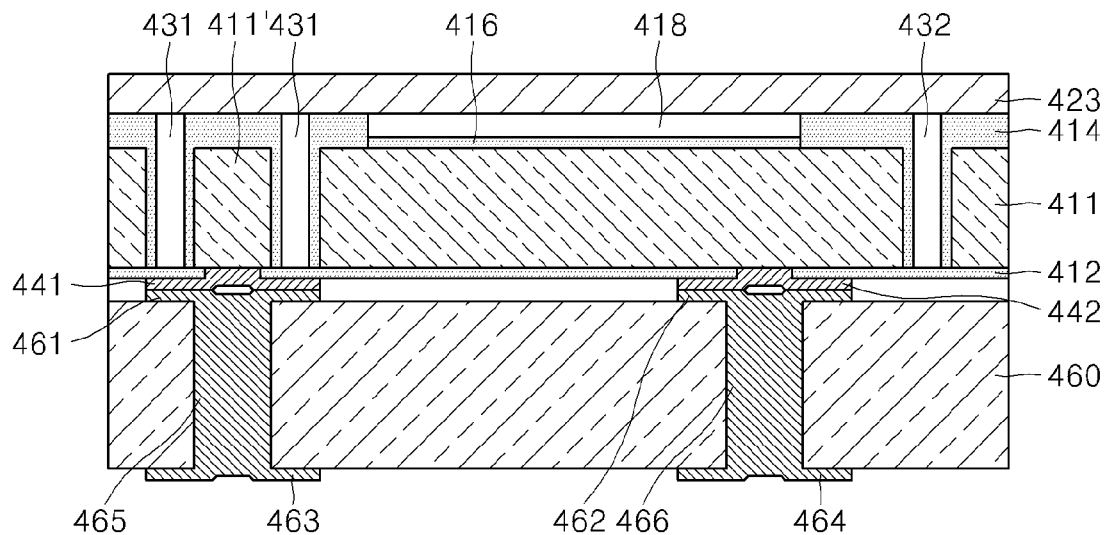

Referring to FIG. 26, the third substrate 421 and the third insulating layer 422 are removed. Accordingly, the fourth substrate 423 constitutes a membrane.

Figure 27:
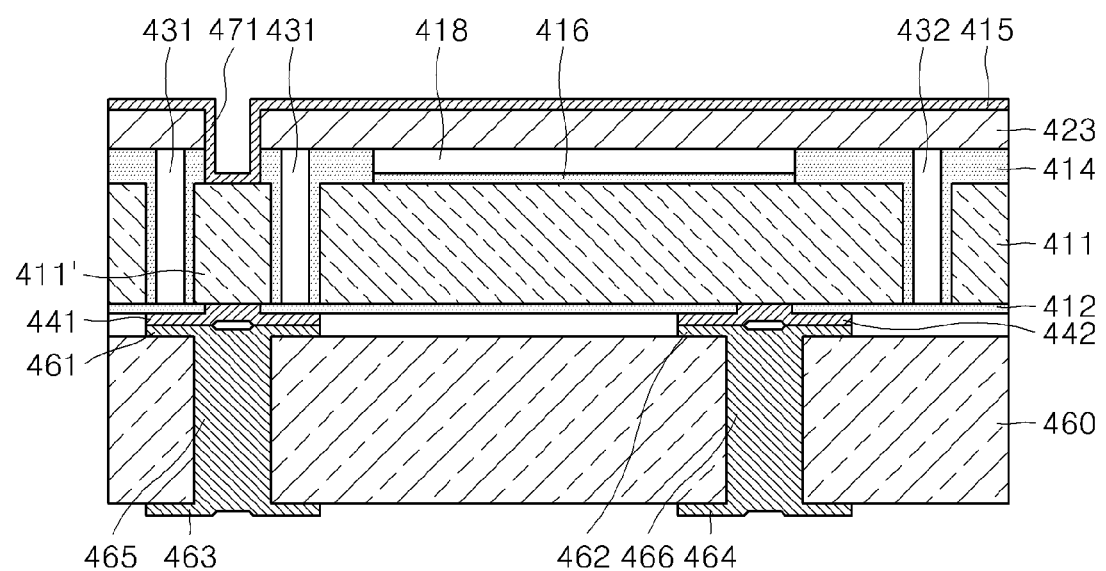

Thereafter, referring to FIG. 27, the fourth substrate 423 and the support 414 are etched to form a via hole 471 that exposes the upper surface of the electrode connection unit 411'. Thereafter, an upper electrode 415 is formed on an upper surface of the fourth substrate 423. In this regard, the upper electrode 415 is formed to contact the upper surface of the electrode connection unit 411' through the via hole 471 so that the upper electrode 415 is electrically connected to the electrode connection unit 411'.

As described above, an electrode connection unit formed by a trench is provided on a conductive substrate, and upper and lower surfaces of the electrode connection unit respectively contact an upper electrode and a first electrode. Accordingly, an electrical signal applied to the first electrode may be transmitted to the upper electrode through the electrode connection unit of the conductive substrate. According to a method of manufacturing an electro-acoustic transducer according to the one or more of the exemplary embodiments, a trench is formed in the conductive substrate, thereby forming the electrode connection unit that electrically connects the first electrode and the upper electrode through a relatively simple process. Two SOI wafers are bonded to manufacture the electro-acoustic transducer, which does not need a CMP process or an aligning process of a substrate, thereby simplifying a manufacturing process.

The foregoing exemplary embodiments and advantages are merely exemplary and are not to be construed as limiting. Descriptions of features or aspects within each exemplary embodiment should be considered as available for other similar features or aspects in other exemplary embodiments.

The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electro-acoustic transducer comprising:
   a conductive substrate in which a first trench is formed to penetrate the conductive substrate, and which comprises an electrode connection unit surrounded by the first trench;
   a membrane provided on an upper portion of the conductive substrate;
   an upper electrode provided on an upper surface of the membrane to contact an upper surface of the electrode connection unit;
   a first electrode provided to contact a lower surface of the electrode connection unit; and
   a second electrode spaced apart from the first electrode and provided to contact the lower surface of the conductive substrate,
   wherein the electrode connection unit is provided to connect the first electrode and the upper electrode electrically.

2. The electro-acoustic transducer of claim 1, wherein a cavity is formed in an upper surface of the conductive substrate to have a predetermined depth, and the membrane is provided on the upper surface of the conductive substrate to cover the cavity.

3. The electro-acoustic transducer of claim 2, further comprising:
   a first insulating layer provided on the lower surface of the conductive substrate; and
   a second insulating layer provided in inner wall surfaces of the first trench and the cavity.

4. The electro-acoustic transducer of claim 1, wherein a support in which a cavity is formed is provided on the conductive substrate, and a membrane is provided on an upper surface of the support to cover the cavity.

5. The electro-acoustic transducer of claim 4, further comprising:
   a first insulating layer provided on the lower surface of the conductive substrate; and
   a second insulating layer provided on a bottom surface of the cavity.

6. The electro-acoustic transducer of claim 1, further comprising:
   a pad substrate coupled to the conductive substrate and comprising a plurality of pads bonded to the first electrode and the second electrode.

7. The electro-acoustic transducer of claim 1, wherein a second trench for separating elements is formed in the conductive substrate.

* * * * *